(12) United States Patent
Iwamoto

(10) Patent No.: US 11,069,645 B2
(45) Date of Patent: Jul. 20, 2021

(54) ELECTRONIC COMPONENT MODULE

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/684,826

(22) Filed: Nov. 15, 2019

(65) Prior Publication Data

US 2020/0083191 A1 Mar. 12, 2020

Related U.S. Application Data

(63) Continuation of application No. PCT/JP2018/020639, filed on May 30, 2018.

(30) Foreign Application Priority Data

Jun. 9, 2017 (JP) .............................. JP2017-114712

(51) Int. Cl.

| H01L 23/48 | (2006.01) |
|---|---|
| H01L 23/52 | (2006.01) |
| H01L 29/40 | (2006.01) |
| H01L 23/00 | (2006.01) |
| H01L 23/29 | (2006.01) |
| H01L 23/538 | (2006.01) |

(52) U.S. Cl.
CPC ............ *H01L 24/45* (2013.01); *H01L 23/293* (2013.01); *H01L 23/5381* (2013.01); *H01L 23/5389* (2013.01); *H01L 2924/14215* (2013.01)

(58) Field of Classification Search
CPC combination set(s) only.
See application file for complete search history.

(56) References Cited

U.S. PATENT DOCUMENTS

| 8,546,932 B1 | 10/2013 | Chung | |
|---|---|---|---|
| 2014/0018126 A1* | 1/2014 | Asai | ..................... H01L 41/0926 |
| | | | 455/550.1 |
| 2016/0315071 A1* | 10/2016 | Zhai | ........................ H01L 24/24 |
| 2017/0047647 A1* | 2/2017 | Jung | ......................... H01Q 1/48 |

(Continued)

FOREIGN PATENT DOCUMENTS

| JP | 2001-144217 A | 5/2001 |
|---|---|---|
| JP | 2005-310954 A | 11/2005 |
| JP | 2015-525007 A | 8/2015 |

OTHER PUBLICATIONS

Official Communication issued in International Patent Application No. PCT/JP2018/020639 dated Jul. 31, 2018.

*Primary Examiner* — Niki H Nguyen
(74) *Attorney, Agent, or Firm* — Keating & Bennett, LLP

(57) ABSTRACT

An electronic component module includes an electronic component, a resin structure, a through wire, and a wiring layer. The resin structure covers at least a portion of the electronic component. The through wire extends through the resin structure in a predetermined direction. The wiring layer electrically connects the electronic component to the through wire. The wiring layer includes a portion located between the electronic component and the through wire in plan view in the predetermined direction. The wiring layer has a protruding portion. The protruding portion protrudes in the predetermined direction between the electronic component and the through wire.

18 Claims, 12 Drawing Sheets

(56) References Cited

U.S. PATENT DOCUMENTS

2018/0076184 A1* 3/2018 Chen ................... H01L 24/19
2018/0181275 A1* 6/2018 Baek ................... G06F 3/147
2019/0097672 A1* 3/2019 Nosaka ............... H03H 9/0576

* cited by examiner

ELECTRONIC COMPONENT MODULE

CROSS REFERENCE TO RELATED APPLICATIONS

This application claims the benefit of priority to Japanese Patent Application No. 2017-114712 filed on Jun. 9, 2017 and is a Continuation Application of PCT Application No. PCT/JP2018/020639 filed on May 30, 2018. The entire contents of each application are hereby incorporated herein by reference.

BACKGROUND OF THE INVENTION

1. Field of the Invention

The present invention relates generally to an electronic component module, and more specifically, to an electronic component module including electronic components and a resin structure.

2. Description of the Related Art

As a related-art electronic component module, there is known a semiconductor package including semiconductor chips (electronic components), an insulating resin layer (resin structure), conductive posts (through wires), connection terminals, wiring layers, and a surface layer (Japanese Unexamined Patent Application Publication No. 2005-310954).

In the semiconductor package described in Japanese Unexamined Patent Application Publication No. 2005-310954, the connection terminals are provided on the top surfaces of the semiconductor chips and the insulating resin layer covers the entire semiconductor chips except their bottom portions, the connection terminals on the semiconductor chips, the conductive posts, and the wiring layers.

The top portion of the conductive post is connected to the connection terminal on the semiconductor chip by the wiring layer. A bump is bonded to the bottom portion of the conductive post.

The surfaces of the wiring layers are coated with the surface layer. Japanese Unexamined Patent Application Publication No. 2005-310954 describes that the same material as that for the insulating resin layer may be used as a material for the surface layer.

In the related-art electronic component module disclosed in Japanese Unexamined Patent Application Publication No. 2005-310954, the wiring layer may be broken, for example, when an external force is applied to the resin structure.

SUMMARY OF THE INVENTION

Preferred embodiments of the present invention provide electronic component modules in which a break of a wiring layer can be significantly reduced or prevented.

An electronic component module according to a preferred embodiment of the present invention includes an electronic component, a resin structure, a through wire, and a wiring layer. The resin structure covers at least a portion of the electronic component. The through wire extends through the resin structure in a predetermined direction. The wiring layer electrically connects the electronic component to the through wire. The wiring layer includes a portion located between the electronic component and the through wire in plan view in the predetermined direction. The wiring layer includes a protruding portion that protrudes in the predetermined direction between the electronic component and the through wire.

In the electronic component modules according to the preferred embodiments of the present invention, the break of the wiring layer can be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
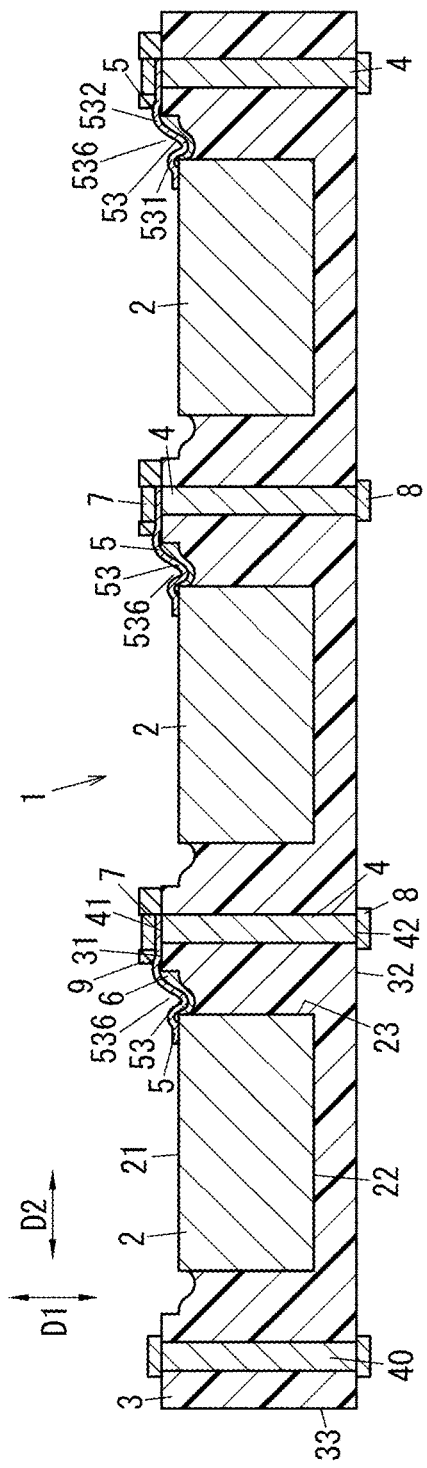
FIG. 1A is a cross-sectional view of an electronic component module according to a preferred embodiment of the present invention.
Figure 1B:
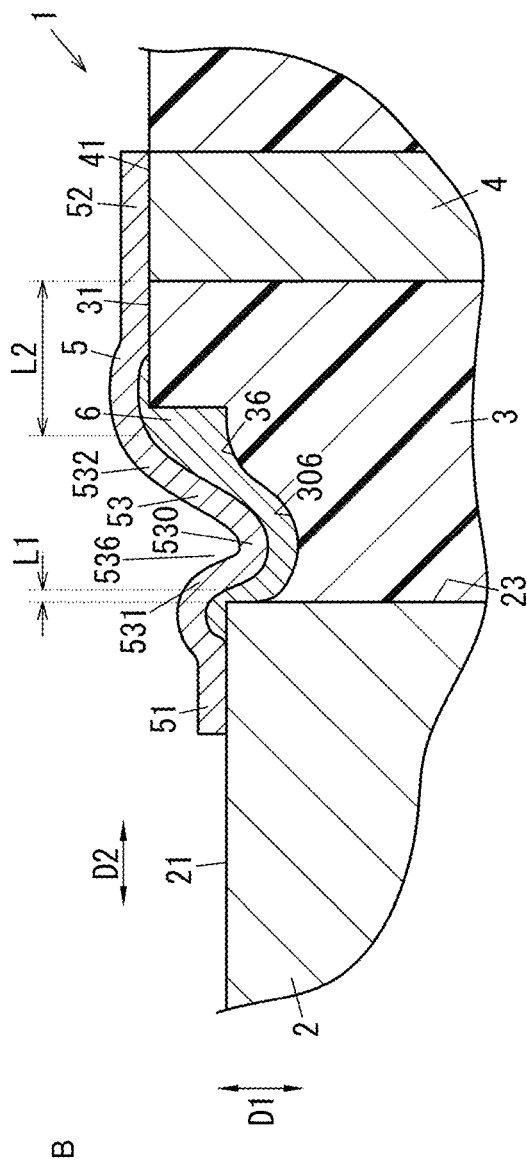
FIG. 1B is an enlarged cross-sectional view of a main portion of the electronic component module.

Preferred embodiments of the present invention will be described in detail with reference to the accompanying drawings.

FIGS. 1A, 1B, 2, and 4A to 12 that are used in the description of the following preferred embodiments and the like are schematic diagrams or views and the ratios of sizes and thicknesses of components and elements in the figures need not essentially reflect actual dimensional ratios.

An electronic component module 1 of a preferred embodiment of the present invention is described below with reference to FIGS. 1A to 3.

The electronic component module 1 includes a plurality of electronic components 2, a resin structure 3, a plurality of through wires 4, and a plurality of wiring layers 5. In the electronic component module 1, the resin structure 3 holds the electronic components 2 and the through wires 4. In the electronic component module 1, the resin structure 3 protects the electronic components 2 from an external shock, water, and the like. The resin structure 3 has an electrical insulating property. The through wires 4 are located on the sides of each electronic component 2 and extend through the resin structure 3 in a thickness direction of the resin structure 3. Each wiring layer 5 electrically connects the electronic component 2 to the through wire 4.

Figure 2:
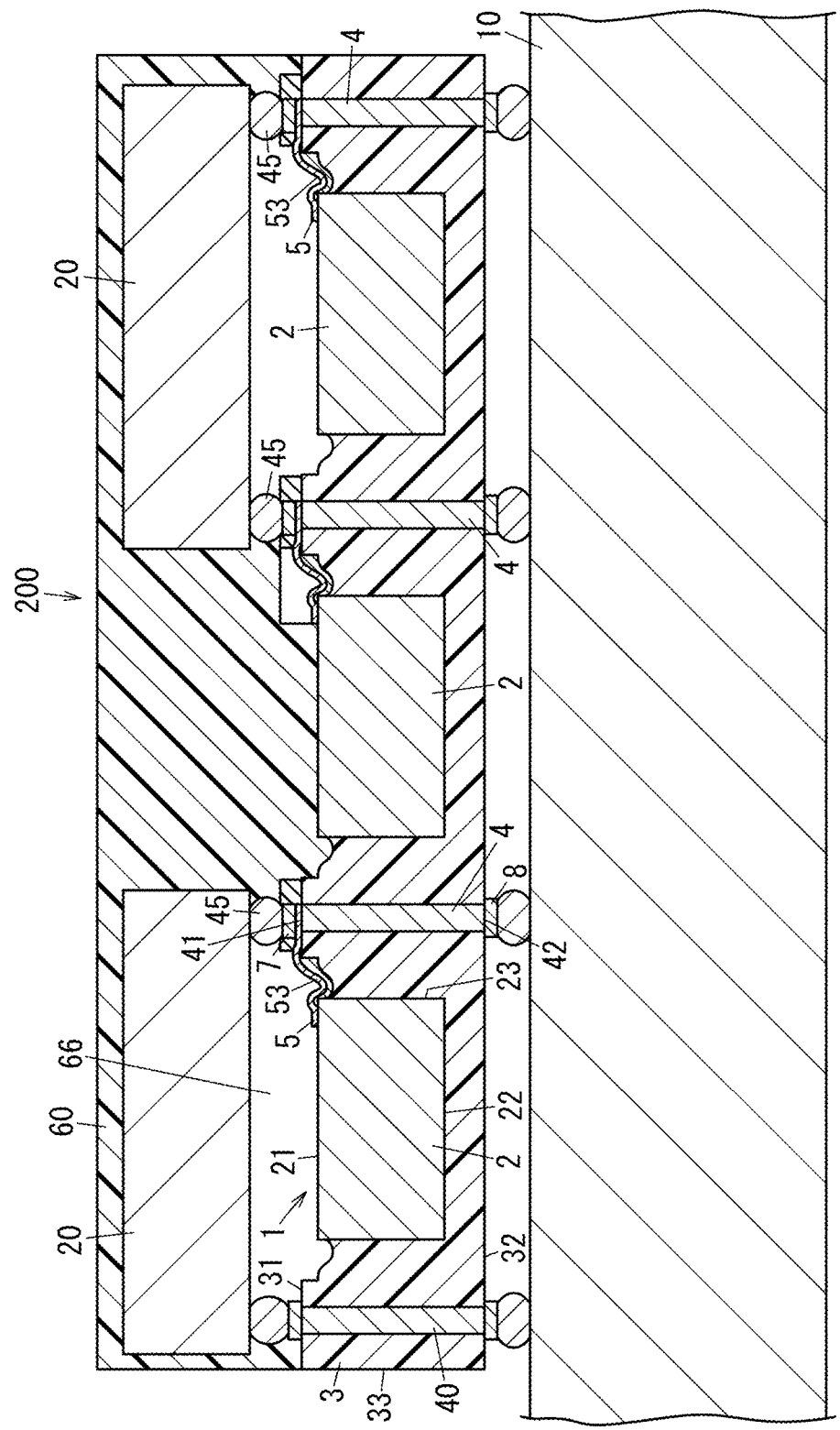
FIG. 2 is a cross-sectional view of a communication module including the electronic component module.

For example, the electronic component module 1 may be used as an interposer to be interposed between electronic components 20 (see FIG. 2) other than the electronic components 2 and a circuit board 10 (see FIG. 2). For example, the circuit board 10 is a printed wiring board.

For example, the electronic component 2 is a SAW (Surface Acoustic Wave) filter but is not limited to the SAW filter. For example, the electronic component 2 may be a BAW (Bulk Acoustic Wave) filter, an RF (Radio Frequency) switch, a thin film capacitor, or a semiconductor device. For example, the other electronic component 20 described above is an IC (Integrated Circuit), an inductor, or a SAW filter. In a communication module 200 (see FIG. 2) including the electronic component module 1, clearances 66 (see FIG. 2) are each secured between a first principal surface 21 of the electronic component 2 that is the SAW filter and the other electronic component 20 described above. The second electronic component 20 and the electronic component module 1 are electrically and mechanically connected to each other with conductive bumps 45 interposed therebetween.

Figure 3:
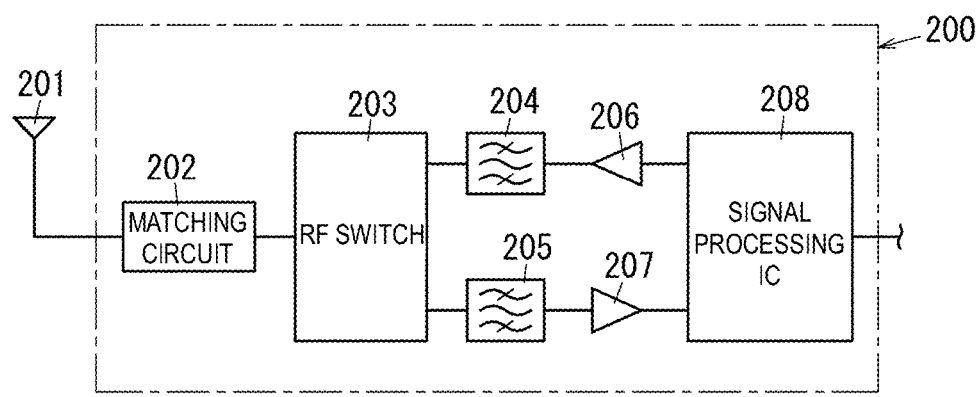
FIG. 3 is a block diagram of the communication module including the electronic component module.

FIG. 3 is a block diagram of an example of the communication module 200 including the electronic component module 1. The communication module 200 includes a matching circuit 202, an RF switch 203, a transmission filter 204, a reception filter 205, a power amplifier 206, a low-noise amplifier 207, and a signal processing IC (Integrated Circuit) 208.

The RF switch 203 includes an antenna common terminal and two individual terminals to which the antenna common terminal is connected switchably and selectively. In the RF switch 203, the antenna common terminal is connected to an antenna 201 with the matching circuit 202 interposed therebetween. In the RF switch 203, one individual terminal of the two individual terminals is connected to an output terminal of the transmission filter 204 and the other individual terminal is connected to an input terminal of the reception filter 205. That is, the RF switch 203 is switchable as appropriate between a first state in which the antenna common terminal is connected to the transmission filter 204 and a second state in which the antenna common terminal is connected to the reception filter 205. The matching circuit 202 matches an impedance of the antenna 201 with an impedance of the antenna common terminal. For example, the matching circuit 202 preferably includes an inductor and a capacitor.

The transmission filter 204 is a band pass filter that passes a transmission signal to the RF switch 203. For example, the transmission filter 204 is preferably a ladder filter including a plurality of resonators. The transmission filter 204 is a SAW filter and each of the plurality of resonators is a SAW resonator.

The reception filter 205 is a band pass filter that passes a reception signal from the antenna 201. For example, the frequency band of the reception signal is higher than the frequency band of the transmission signal. For example, the reception filter 205 is preferably a ladder filter including a plurality of resonators. Preferably, the reception filter 205 is a SAW filter and each of the plurality of resonators is a SAW resonator. The reception signal received by the antenna 201 is input to the reception filter 205 with the RF switch 203 interposed therebetween.

The power amplifier 206 amplifies a high-frequency transmission signal output from the signal processing IC 208 and outputs the amplified transmission signal to the transmission filter 204.

The low-noise amplifier 207 amplifies a high-frequency reception signal output from the reception filter 205 and outputs the amplified reception signal to the signal processing IC 208.

The signal processing IC 208 performs predetermined signal processing for the transmission signal and the reception signal.

In the communication module 200, for example, the RF switch 203, the transmission filter 204, the reception filter 205, and the capacitor are the electronic components 2 of the electronic component module 1 and the power amplifier 206, the low-noise amplifier 207, the signal processing IC 208, and the inductor are the other electronic components 20. The structure of the communication module 200 including the electronic component module 1 is not limited to that in the example of FIG. 3.

The elements of the electronic component module 1 are described below in more detail.

As described above, the electronic component module 1 includes the plurality of electronic components 2, the resin structure 3, the plurality of through wires 4, and the plurality of wiring layers 5.

The electronic component 2 includes the first principal surface 21 and a second principal surface 22 located opposite each other in a predetermined direction D1 of the electronic component module 1 (hereinafter referred to also as a first direction D1). More specifically, the electronic component 2 has a plate shape and includes the first principal surface 21 and the second principal surface 22 located opposite each other in its thickness direction. The first principal surface 21 and the second principal surface 22 are arranged back to back. The electronic component 2 also includes a lateral surface 23. The plan shape of the electronic component 2 (outer peripheral shape of the electronic component 2 that is viewed in its thickness direction) is preferably a rectangular or substantially rectangular shape but is not limited to the rectangular or substantially rectangular shape and may be, for example, a square or substantially square shape.

If the electronic component 2 is the SAW filter, the electronic component 2 includes, for example, a piezoelectric substrate including a front surface (first principal surface) and a back surface (second principal surface) located opposite each other in its thickness direction, and a functional portion provided on the front surface of the piezoelectric substrate. For example, the piezoelectric substrate is preferably a $LiTaO_3$ substrate or a $LiNbO_3$ substrate. For example, the thickness of the piezoelectric substrate is preferably about 200 μm. For example, the functional portion includes a plurality of IDT (Interdigital Transducer) electrodes. The functional portion may include an external connection terminal electrode. The number of terminal electrodes may be one or a plurality. If the electronic component 2 is the SAW filter, the first principal surface 21 of the electronic component 2 includes, for example, an exposed portion on the front surface of the piezoelectric substrate, and an exposed surface of the functional portion. If the electronic component 2 is the SAW filter, the structure of the electronic component 2 is not limited to a structure including a bulk piezoelectric substrate. For example, the electronic component 2 may have a stacked structure in which a silicon substrate, a silicon oxide film, and a piezoelectric thin film are stacked in this order and may include a functional portion (IDT electrodes and terminal electrodes) provided on the piezoelectric thin film. For example, the piezoelectric thin film is preferably a $LiTaO_3$ thin film or a $LiNbO_3$ thin film. The thickness of the piezoelectric thin film is preferably $3.5\lambda$ or less, for example, provided that $\lambda$ represents a wave length of an acoustic wave that is determined based on an electrode finger period of the IDT electrodes. For example, the thickness of the piezoelectric thin film is about 0.5 μm. The thickness of the silicon oxide film is preferably $2.0\lambda$ or less, for example. For example, the thickness of the silicon oxide film is preferably about 0.5 μm. For example, the thickness of the stacked structure is preferably about 200 μm.

The resin structure 3 includes a first surface 31 and a second surface 32 located opposite each other in the first direction D1 of the electronic component module 1. More specifically, the resin structure 3 has a plate shape and includes the first surface 31 and the second surface 32 located opposite each other in its thickness direction. The first surface 31 and the second surface 32 are arranged back to back. The resin structure 3 also includes a lateral surface 33. The plan shape of the resin structure 3 (outer peripheral shape of the resin structure 3 that is viewed in its thickness direction) is preferably a rectangular or substantially rectangular shape but is not limited to the rectangular or substantially rectangular shape and may be, for example, a square or substantially square shape. The plan size of the resin structure 3 is larger than the plan size of the electronic component 2.

The resin structure 3 covers the second principal surface 22 and a portion of the lateral surface 23 of each electronic component 2. Regarding the lateral surface 23 of each electronic component 2, the resin structure 3 covers a portion of the lateral surface 23 of each electronic component 2. The description "cover a portion of the lateral surface 23" means that the resin structure 3 covers the entire circumference of the lateral surface 23 in a range from a position shifted from a first end of the lateral surface 23 on the first principal surface 21 side toward a second end of the lateral surface 23 on the second principal surface 22 side to a boundary between the lateral surface and the second principal surface 22. The first principal surface 21 of each electronic component 2 is exposed on the first surface 31 side of the resin structure 3. In the electronic component module 1, the electronic component 2 is embedded in the resin structure 3 so that the first principal surface 21 of the electronic component 2 is exposed. The distance in the first direction D1 between the first surface 31 and the second surface 32 of the resin structure 3 is longer than the distance in the first direction D1 between the first principal surface 21 and the second principal surface 22 of the electronic component 2.

The resin structure 3 is preferably made of, for example, a resin having an electrical insulating property. In addition to the resin, the resin structure 3 includes, for example, a filler mixed in the resin but the filler is not an essential element. For example, the resin is preferably an epoxy resin but is not limited to the epoxy resin. For example, the resin may be an acrylic resin, a urethane resin, a silicone resin, or a fluorocarbon resin. The filler is preferably an inorganic filler, for example, silica or alumina. In addition to the resin and the filler, the resin structure 3 may include a black pigment, for example, carbon black.

In the electronic component module 1, corresponding through wires 4 are arranged on the sides of each of the plurality of electronic components 2. The plurality of through wires 4 are located away from the corresponding electronic component 2 in a second direction D2 orthogonal to the first direction D1. The plurality of through wires 4 are held by the resin structure 3.

The through wire 4 has a pillar shape (columnar shape in this case) and includes a first end surface 41 and a second end surface 42 located opposite each other in a direction parallel or substantially parallel to the thickness direction of the resin structure 3. That is, the through wire 4 includes the first end surface 41 and the second end surface 42 located opposite each other in the first direction D1. The first end surface 41 of the through wire 4 is flush or substantially flush with the first surface 31 of the resin structure 3. The second end surface 42 of the through wire 4 is flush or substantially flush with the second surface 32 of the resin structure 3. A portion of the wiring layer 5 is stacked on the first end surface 41 of the through wire 4. Thus, in the electronic component module 1, the through wire 4 is electrically connected to the wiring layer 5.

In the electronic component module 1, the corresponding through wire 4 is electrically connected to each of the plurality of electronic components 2 with the corresponding wiring layer 5 interposed therebetween. The electronic component module 1 is not particularly limited in terms of the position of the through wire 4 and the number of through wires 4 for each of the plurality of electronic components 2.

For example, the material for the through wire 4 is a metal or an alloy. In the electronic component module 1 of this preferred embodiment, the material for the through wire 4 is preferably, for example, Cu. The material for the through wire 4 is not limited to Cu and may be, for example, Ni. For example, the through wire 4 is formed by electrolytic plating.

The electronic component module 1 further includes a second through wire 40 electrically connected to the other electronic component 20 in addition to the through wire 4 (hereinafter referred to also as a first through wire 4) electrically connected to the electronic component 2 with the wiring layer 5 interposed therebetween but the second through wire 40 is not an essential element. The material for the second through wire 40 is preferably Cu similarly to the first through wire 4.

The wiring layer 5 electrically connects the electronic component 2 to the through wire 4 on the first surface 31 side of the resin structure 3 and on the first principal surface 21 side of the electronic component 2. The wiring layer 5 includes a portion located between the electronic component 2 and the through wire 4 in plan view in the predetermined direction D1. The wiring layer 5 includes a first end 51 connected to the first principal surface 21 of the electronic component 2 (surface of a terminal portion thereof), and a second end 52 connected to the through wire 4. The first end 51 of the wiring layer 5 is stacked on the first principal surface 21 of the electronic component 2 (surface of the terminal portion thereof). The second end 52 of the wiring layer 5 is stacked on the first end surface 41 of the through wire 4. The wiring layer 5 is arranged across the first principal surface 21 of the electronic component 2, the first surface 31 of the resin structure 3, and the first end surface 41 of the through wire 4. For example, the thickness of the wiring layer 5 is preferably about 5 µm or more and about 10 µm or less.

For example, the material for the wiring layer 5 is a metal or an alloy. In the electronic component module 1 of the present preferred embodiment, the material for the wiring layer 5 is preferably, for example, Cu. That is, the wiring layer 5 is preferably a Cu layer. The structure of the wiring layer 5 is not limited to a monolayer structure and may be a stacked structure in which a plurality of layers are stacked. The wiring layer 5 is a plated layer. The method of forming the wiring layer 5 is not limited to plating and may be, for example, sputtering.

The electronic component module 1 further includes resin layers 6 each interposed between the wiring layer 5 and each of the resin structure 3 and the electronic component 2. The Young's modulus of the resin layer 6 is smaller than the Young's modulus of the resin structure 3. The resin layer 6 has an electrical insulating property. The resin layer 6 is made of a resin. If the resin of the resin structure 3 is, for example, an epoxy resin or an acrylic resin, the resin of the resin layer 6 may be selected from among, for example, a polyimide, polybenzoxazole, and a phenol resin. For example, the Young's modulus of the resin structure 3 is preferably about 0.6 GPa or more and about 5 GPa or less. The Young's modulus of the resin layer 6 is preferably about 0.5 GPa, for example. Although the electronic component 2 includes a plurality of elements, the Young's modulus of the electronic component 2 described below is a Young's modulus of a portion of the electronic component 2 that is located on the first principal surface 21 side to which the wiring layer 5 is connected. More specifically, if the electronic component 2 is the SAW filter, the Young's modulus of the electronic component 2 is a Young's modulus of $LiTaO_3$, $LiNbO_3$, or the like. If the electronic component 2 is the BAW filter, the same or similar features apply as in the case of the SAW filter. If the electronic component 2 is a Si-based semiconductor device, the Young's modulus of the electronic component 2 is a Young's modulus of Si. The Young's moduli of $LiTaO_3$, $LiNbO_3$, and Si are about 200 GPa, about 230 GPa, and about 170 GPa, respectively. If the material for the wiring layer 5 is Cu, the Young's modulus of the wiring layer 5 is, for example, about 120 GPa. For example, the Young's modulus is a value determined based on test results obtained by a mechanical test method. If the Young's modulus is discussed in terms of its relative magnitude relationship, the Young's modulus is not limited to the value determined based on the test results obtained by the mechanical test method and may be, for example, a value determined by a resonance method or an ultrasonic pulse method.

The resin layer 6 covers a portion of the resin structure 3 and a portion of the first principal surface 21 of the electronic component 2. The resin layer 6 is provided across a surface 36 of the resin structure 3 (surface that defines the inner surface of a recessed portion 306 provided in a structure including the resin structure 3 and the electronic component 2), the lateral surface 23 of the electronic component 2, and the first principal surface 21 of the electronic component 2 and covers a boundary between the resin structure 3 and the electronic component 2 on the first surface 31 side of the resin structure 3. For example, the thickness of the resin layer 6 is preferably about 1 µm or more and about 5 µm or less. The resin layer 6 has a shape conforming or similar to the shape of the wiring layer 5.

The electronic component module 1 may further include external connection electrodes 7 (hereinafter referred to as first electrodes 7) each provided on the second end 52 of the wiring layer 5, and external connection electrodes 8 (hereinafter referred to as second electrodes 8) each provided across the second end surface 42 of the through wire 4 and the second surface 32 of the resin structure 3. In this case, the first electrode 7 and the second electrode 8 are electrically connected to each other by the through wire 4 interposed therebetween. The electronic component module 1 may further include resist layers 9 each provided on the wiring layer 5 between the second end 52 of the wiring layer 5 and a protruding portion 53 of the wiring layer 5 described later. The resist layer 9 is made of a material having a lower wettability than those for the first electrode 7 and the wiring layer 5. For example, the resist layer 9 is preferably a polyimide layer. Thus, in the electronic component module 1, it is possible to prevent the occurrence of a case in which solder spreads out over the wiring layer 5 when the first electrode 7 is soldered to the other electronic component 20 or the like.

For example, the first electrode 7 is preferably a laminate film including a Ti film on the second end 52 of the wiring layer 5 and a Au film on the Ti film. For example, the second electrode 8 is preferably a laminate film provided across the second end surface 42 of the through wire 4 and the second surface 32 of the resin structure 3 and including a Ti film and a Au film on the Ti film. The laminate structures of the first electrode 7 and the second electrode 8 are merely examples and not limited to those examples.

The wiring layer 5 includes the protruding portion 53 including the portion located between the electronic component 2 and the through wire 4 in plan view in the predetermined direction D1 and protruding in the predetermined direction D1 (first direction D1) between the electronic component 2 and the through wire 4 (extending through the resin structure 3). In the electronic component module 1, the protruding portion 53 is deformed, for example, when an external force is applied to the resin structure 3. Thus, it is more likely that a break of the wiring layer 5 is significantly reduced or prevented than in a case in which the wiring layer 5 does not include the protruding portion 53 (the wiring layer 5 is linear between the electronic component 2 and the through wire 4). The wiring layer 5 includes the protruding portion 53 between the first end 51 and the second end 52. The protruding portion 53 is located on the side of the electronic component 2 in the second direction D2 between the electronic component 2 and the through wire 4. The protruding portion 53 protrudes in the thickness direction of the resin structure 3 (first direction D1). Thus, in the electronic component module 1, the break of the wiring layer 5 can be significantly reduced or prevented because the protruding portion 53 is likely to deform, for example, when an external force such as a shock is applied to the resin structure 3 from the side of the resin structure 3. That is, in the electronic component module 1, the protruding portion 53 mitigates a stress caused in the wiring layer 5 due to, for example, a difference in the Young's modulus between the resin structure 3 and the electronic component and a difference in the Young's modulus between the resin structure 3 and the wiring layer 5 when the external force is applied to the resin structure 3. The protruding portion 53 includes a cavity 536 isolated from the resin structure 3. In the electronic component module 1, the protruding portion 53 also mitigates a stress applied to the wiring layer 5 due to, for example, a difference in a coefficient of linear expansion between the resin structure 3 and the electronic component 2 and a difference in the coefficient of linear expansion the resin structure 3 and the wiring layer 5.

In the electronic component module 1, a minimum distance L1 between a boundary between the first principal surface 21 and the lateral surface 23 of the electronic component 2 and the protruding portion 53 of the wiring layer 5 is shorter than a minimum distance L2 between the through wire 4 and the protruding portion 53. That is, in the electronic component module 1, the protruding portion 53 of the wiring layer 5 is preferably located near the electronic component 2, for example. Thus, in the electronic component module 1, the break of the wiring layer 5 can further be significantly reduced or prevented near the boundary between the resin structure 3 and the electronic component 2.

The protruding portion 53 is rounded from the viewpoint of further significantly reducing or preventing the break of the wiring layer 5. The rounding of the protruding portion 53 means that the protruding portion 53 is rounded so that at least a distal end 530 of the protruding portion 53 in its protruding direction (first direction D1) is not angulated when viewed in a width direction of the wiring layer 5 (direction orthogonal to both the first direction D1 and the second direction D2). In the electronic component module 1, the break of the wiring layer 5 can further be significantly reduced or prevented by rounding the protruding portion 53. The protruding portion 53 includes the distal end 530 described above, a first proximal end 531 on the first end 51 side, and a second proximal end 532 on the second end 52 side. The distal end 530 of the protruding portion 53 is located on the second principal surface 22 side of the electronic component 2 with respect to the first principal surface 21 in the protruding direction (first direction D1). The distal end 530 of the protruding portion 53 is located on the second surface 32 side of the resin structure 3 with respect to the first surface 31 in the protruding direction (first direction D1). The first proximal end 531 is a portion of the wiring layer 5 located above the first principal surface 21 of the electronic component 2 in the wiring layer 5 ranging from the distal end 530 of the protruding portion 53 to the first end 51. The second proximal end 532 is a portion of the wiring layer 5 located above the first surface 31 of the resin structure 3 in the wiring layer 5 ranging from the distal end 530 of the protruding portion 53 to the second end 52. The protruding portion 53 preferably has a U-shape when viewed in the width direction of the wiring layer 5 but the shape is not limited to the U-shape. When the protruding portion 53 is viewed in the width direction of the wiring layer 5, each of the distal end 530, the first proximal end 531, and the second proximal end 532 is curved into an arc shape. Thus, the wiring layer 5 can mitigate stress concentration on the protruding portion 53.

Since the electronic component module 1 includes the resin layer 6, ground portions corresponding to the distal end 530, the first proximal end 531, and the second proximal end 532 of the protruding portion 53 of the wiring layer 5 can be rounded, thus further significantly reducing or preventing the break of the wiring layer 5.

The protruding portion 53 protrudes toward the resin structure 3 in the first direction D1. More specifically, the protruding portion 53 protrudes toward the resin structure 3 in the thickness direction of the resin structure 3. The protruding portion 53 is curved and protrudes from the first surface 31 of the resin structure 3 toward the second surface 32. In the structure including the resin structure 3 and the electronic component 2, the recessed portion 306 described above where the protruding portion 53 is arranged on its inner side is provided around the electronic component 2 on the first surface 31 side of the resin structure 3. In the electronic component module 1, the protruding portion 53 includes the cavity 536 described above. More specifically, the cavity 536 is a space in the protruding portion 53 between a first portion between the distal end 530 and the first proximal end 531 and a second portion between the distal end 530 and the second proximal end 532. Thus, in the electronic component module 1, the protruding portion 53 is likely to deform, thereby attaining an advantage in that the protruding portion 53 is likely to mitigate the stress applied to the wiring layer 5.

Since the electronic component module 1 includes the resin layer 6 described above, the wiring layer 5 can be prevented from becoming excessively thin in portions thereof. Thus, the break of the wiring layer 5 can be significantly reduced or prevented.

An example of a method of manufacturing the electronic component module 1 is briefly described below with reference to FIGS. 4A to 6B.

In the method of manufacturing the electronic component module 1, the electronic components 2 are prepared and then a first step to an eighth step are performed sequentially.

In the first step, a multilayer body 112 including a support 110 having a flat-plate shape and a conductive layer 111 bonded to one surface of the support 110 in its thickness direction with an adhesive layer is prepared first. Then, a liquid (pasty) resin bonding layer 113 is formed on the conductive layer 111 of the multilayer body 112. Then, the first principal surfaces 21 of the electronic components 2 are caused to face the resin bonding layer 113 and the electronic components 2 are pushed against the resin bonding layer 113 so that a portion of the resin bonding layer 113 rises along the lateral surfaces 23 of the electronic components 2 (see FIG. 4A). Thus, in the first step, the electronic components 2 are temporarily fixed to the resin bonding layer 113. The resin bonding layer 113 is preferably formed of a photosensitive positive resist, for example. The resin bonding layer 113 preferably has a good wettability with the lateral surfaces 23 of the electronic components 2, for example, so that when the electronic components 2 are pushed against the resin bonding layer 113, a portion of the resin bonding layer 113 rises along the lateral surfaces 23 of the electronic components 2 to form rising portions 116. For example, the wettability with the lateral surfaces 23 of the electronic components 2 can be adjusted by the viscosity of the resin bonding layer 113.

In the second step, a positive photoresist layer that covers exposed portions of the resin bonding layer 113 and the electronic components 2 is formed first. Then, portions of the photoresist layer and the resin bonding layer 113 that are located at positions where the through wires 4 are to be formed are removed by using a photolithography technique (opening portions are formed at the positions where the through wires 4 are to be formed), thereby exposing ground portions for the through wires 4 in the conductive layer 111. Then, conductive pillars 400 defining and functioning as the through wires 4 are formed by electrolytic plating and then the resin bonding layer 113 is pattered by using the photolithography technique to leave portions of the resin bonding layer 113 that are interposed between the first principal surfaces 21 of the electronic components 2 and the conductive layer 111 in the thickness direction of the electronic component 2 and the rising portions 116 that rise along the lateral surfaces 23 of the electronic components 2 (see FIG. 4B). In the present preferred embodiment, the shape of the conductive pillar 400 is a columnar shape. For example, the material for the conductive pillar 400 is Cu but is not limited to Cu. For example, the material may be Ni. To form the conductive pillar 400, a current is caused to flow between an anode arranged to face the surface of the photoresist layer across a plating solution including a copper sulfate and a cathode formed of the conductive layer 111, thereby precipitating the conductive pillar 400 on the exposed surface of the conductive layer 111 in a thickness direction of the photoresist layer.

Figure 4A:
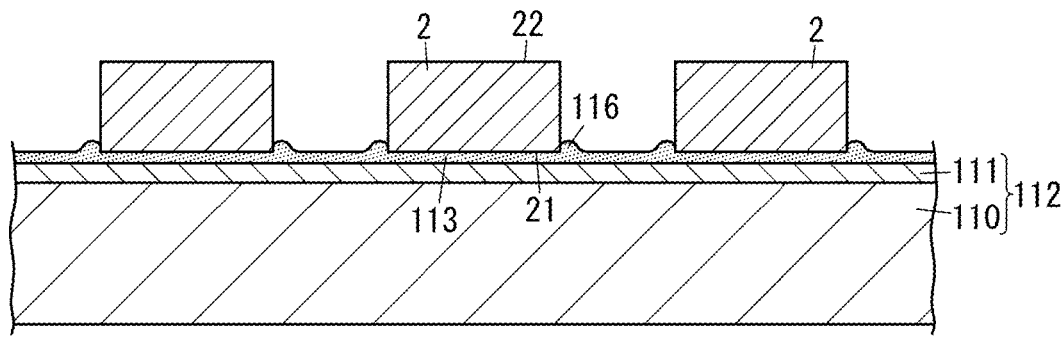
FIGS. 4A to 4C are process cross-sectional views showing a first example of a method of manufacturing the electronic component module.
Figure 4B:
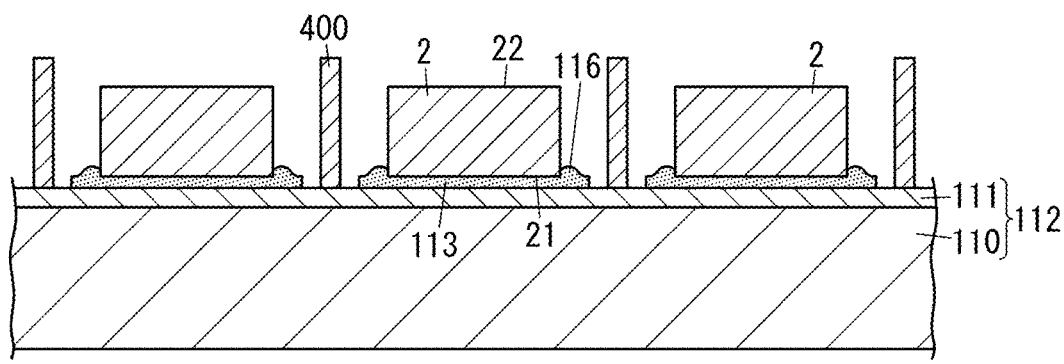
Figure 4C:
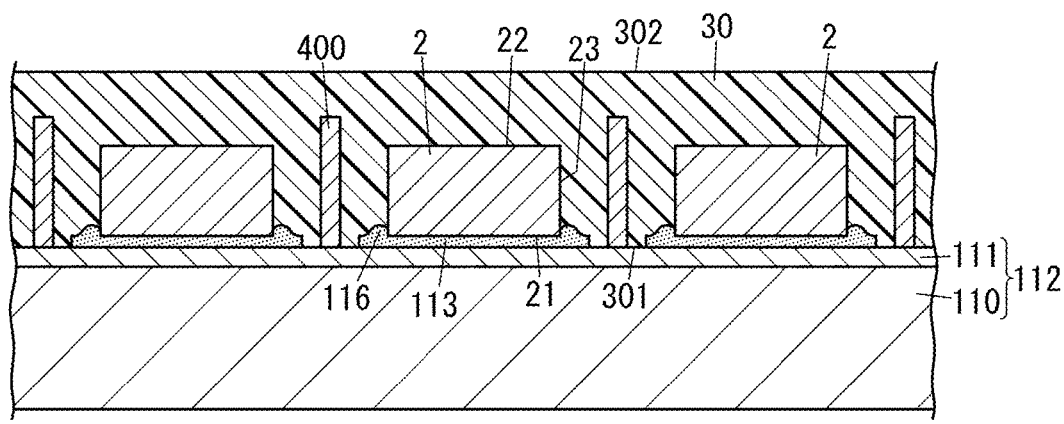

In the third step, a resin structure layer 30 defining and functioning as the resin structure 3 is formed on the multilayer body 112 and covers the electronic components 2, the conductive pillars 400, the exposed portions of the resin bonding layer 113, and the exposed portions of the conductive layer 111 (see FIG. 4C). That is, in the third step, the resin structure layer 30 is formed on the conductive layer 111 of the multilayer body 112. The resin structure layer 30 includes a first surface 301 and a second surface 302 located opposite each other in its thickness direction. The first surface 301 and the second surface 302 are arranged back to back. The first surface 301 of the resin structure layer 30 is a surface in contact with the conductive layer 111 of the multilayer body 112. A portion of the resin bonding layer 113 is interposed between the first principal surface 21 of each electronic component 2 and the conductive layer 111. Regarding the electronic component 2, the resin structure layer 30 covers the second principal surface 22 and the lateral surface 23 of the electronic component 2. Regarding the conductive pillar 400, the resin structure layer 30 covers the lateral surface and the distal end surface of the conductive pillar 400. Thus, the resin structure layer 30 is thicker than the resin structure 3 (see FIG. 1A). A portion of the resin structure layer 30 is interposed between the second surface 302 of the resin structure layer 30 and the distal end surface of the conductive pillar 400.

In the third step, the resin structure layer 30 is formed by a press molding method but the method is not limited to the press molding method. For example, in the third step, the resin structure layer 30 may be formed by applying a material for the resin structure layer 30 on the multilayer body 112 using a spin coating method, a transfer molding method, or the like to cover the electronic components 2, the conductive pillars 400, the exposed portions of the resin bonding layer 113, and the exposed portions of the conductive layer 111 and then curing the material with heat or an ultraviolet ray.

Figure 5A:
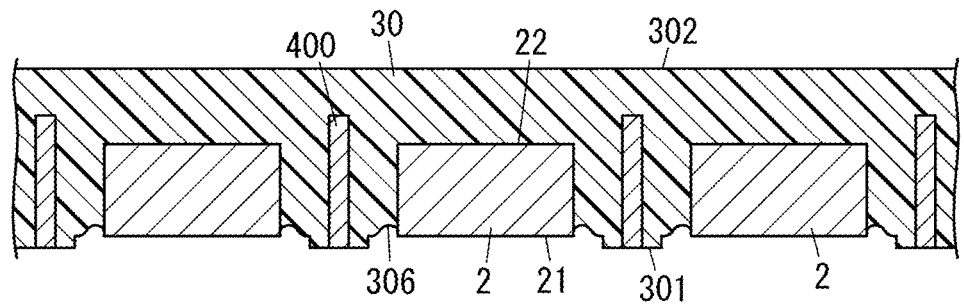
FIGS. 5A to 5C are process cross-sectional views showing the first example of the method of manufacturing the electronic component module.

In the fourth step, the multilayer body 112 and the resin bonding layer 113 are removed from the structure including the resin structure layer 30, the electronic components 2, the conductive pillars 400, the resin bonding layer 113, and the multilayer body 112 (see FIG. 5A). Thus, in the fourth step, the first surface 301 of the resin structure layer 30, the first principal surfaces 21 of the electronic components 2, and the conductive pillars 400 can be exposed. In the structure including the resin structure layer 30 and the electronic components 2, the recessed portion 306 is formed around each electronic component 2 on the first surface 301 side of the resin structure layer 30. The recessed portion 306 reflects or conforms to the shape of the rising portion 116 of the resin bonding layer 113 described above. In the fourth step, the support 110 of the multilayer body 112 is removed (peeled off) by, for example, reducing the adhesive strength of the adhesive layer that bonds the conductive layer 111 to the support 110. The adhesive layer is preferably formed, for example, of an adhesive whose adhesive strength can be reduced by using an ultraviolet ray, an infrared ray, or heat.

After the support 110 of the multilayer body 112 is removed, the conductive layer 111 can be removed by, for example, wet etching. In the fourth step, the resin bonding layer 113 can be removed by exposing the resin bonding layer 113 with light and then developing the resin bonding layer 113.

Figure 5B:
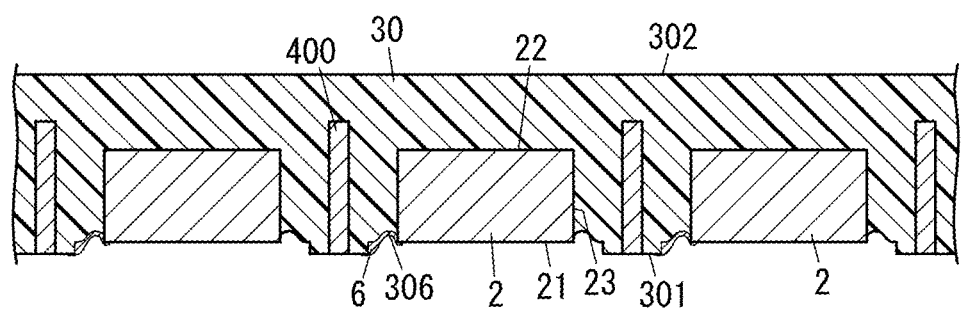

In the fifth step, the resin layers 6 defining and functioning as grounds for a portion of the wiring layers 5 are formed (see FIG. 5B). In the fifth step, the resin layers 6 are formed by, for example, applying a liquid photosensitive resin by spin coating or spray coating and then pattering the photosensitive resin layer using the photolithography technique. For example, a polyimide, polybenzoxazole, or a phenol resin may be used as the photosensitive resin. Through the fifth step, the inner surface of the recessed portion 306 of the structure including the resin structure layer 30 and the electronic component 2 (including a portion of the lateral surface 23 of the electronic component 2) and a portion of the first principal surface 21 of the electronic component 2 are covered and the ground for the wiring layer 5 can be made smoother.

Figure 5C:
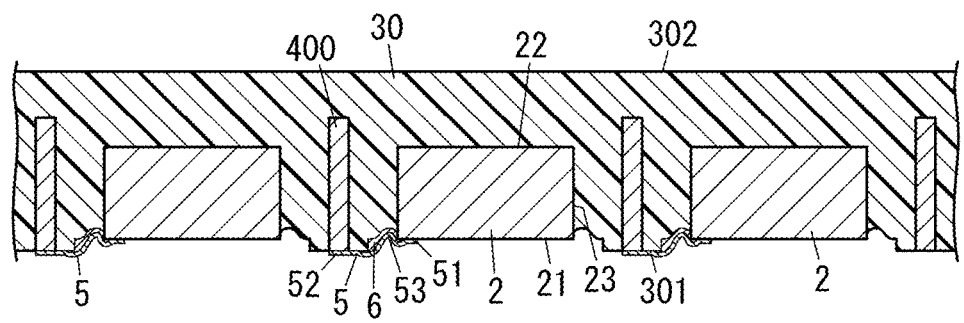

In the sixth step, the wiring layers 5 are formed (see FIG. 5C). In the sixth step, the wiring layers 5 are formed by, for example, plating, the photolithography technique, and the etching technique.

Figure 6A:
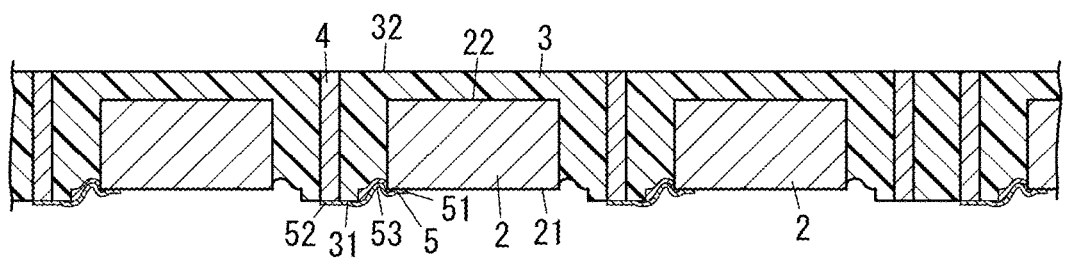
FIGS. 6A and 6B are process cross-sectional views showing the first example of the method of manufacturing the electronic component module.

In the seventh step, the resin structure 3 is formed by grinding the resin structure layer 30 from the second surface 302 side opposite to the first surface 301 until the thickness of the resin structure 3 is attained (see FIG. 6A). That is, in the seventh step, the resin structure layer 30 is ground so that the distal end surfaces of the conductive pillars 400 are exposed and the second surface 302 of the resin structure layer 30 becomes flush or substantially flush with the distal end surfaces of the conductive pillars 400. In the seventh step, the distal end surfaces of the conductive pillars 400 are exposed, but it is not essential that the distal end surfaces of the conductive pillars 400 become flush or substantially flush with the second surface 302 of the resin structure layer 30. Through the seventh step, the through wires 4 are formed from the conductive pillars 400 and the resin structure 3 is formed.

Figure 6B:
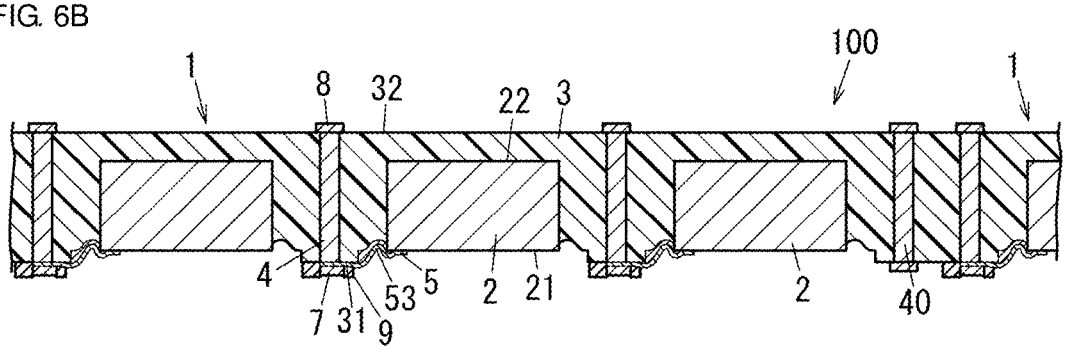

In the eighth step, the first electrodes 7 and the second electrodes 8 are formed and then the resist layers 9 are formed (see FIG. 6B). In the eighth step, the first electrodes 7 and the second electrodes 8 are formed by a thin film forming technique such as sputtering, the photolithography technique, and the etching technique. In the eighth step, the resist layers 9 are formed by a coating technique such as spin coating and the photolithography technique.

If a multilayer body 112 sized so that an aggregate 100 of a plurality of electronic component modules 1 can be formed as the multilayer body 112 is used in the first step, the aggregate 100 of the plurality of electronic component modules 1 can be formed through the first step to the eighth step.

In this case, the plurality of electronic component modules 1 can be obtained by, for example, cutting the aggregate 100 of the plurality of electronic component modules 1 with a dicing machine to separate the aggregate 100 into the individual electronic component modules 1.

To manufacture the communication module 200 including the electronic component module 1, a ninth step and a tenth step described below may be performed after the eighth step and then individual communication modules 200 may be obtained by separation. Thus, a plurality of communication modules 200 are obtained.

In the ninth step, for example, the electronic components 20 (hereinafter referred to also as second electronic components 20) other than the electronic components 2 of the electronic component module 1 (hereinafter referred to also as first electronic components 2) are mounted on the electronic component module 1. More specifically, in the ninth step, terminal electrodes of the second electronic components 20 and the first electrodes 7 of the electronic component module 1 are electrically and mechanically connected to each other with the conductive bumps 45 interposed therebetween (see FIG. 7A). The conductive bump 45 is a solder bump but is not limited to the solder bump and may be, for example, a gold bump.

Figure 7A:
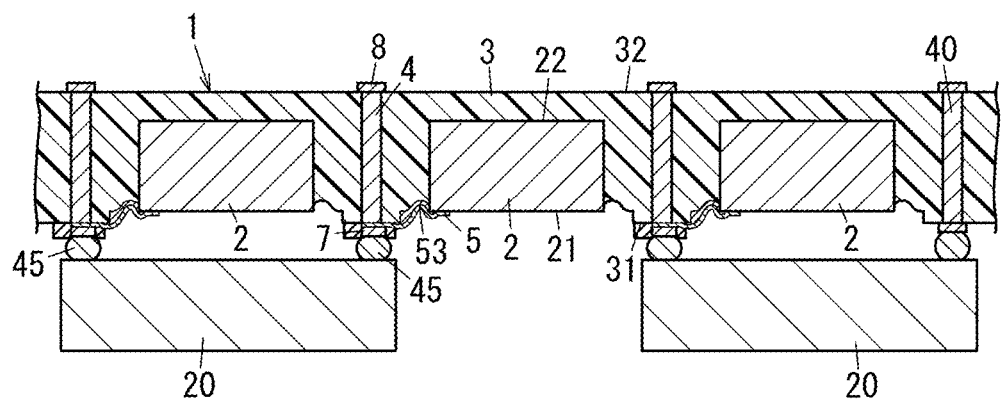
FIGS. 7A to 7C are process cross-sectional views showing an example of a method of manufacturing the communication module including the electronic component module.
Figure 7B:
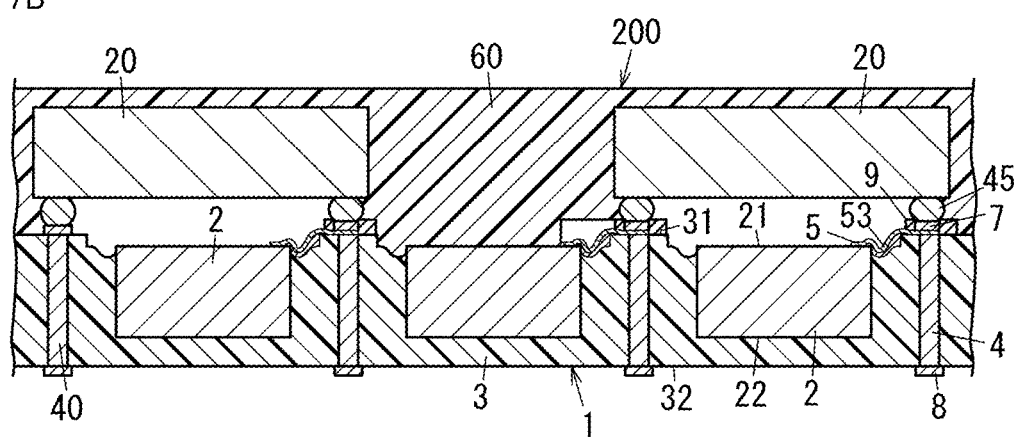
Figure 7C:
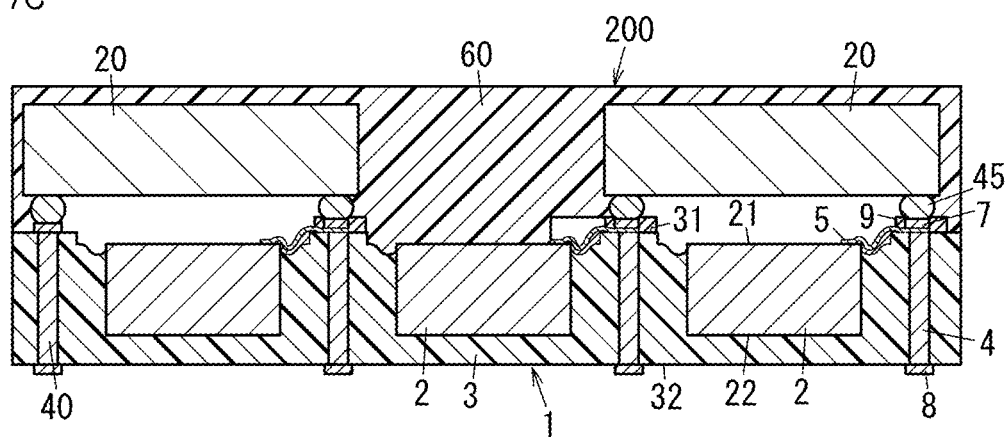

In the tenth step, a cover layer 60 that covers the second electronic components 20 is formed (see FIG. 7B). For example, a polyimide, benzocyclobutene, polybenzoxazole, a phenol resin, or a silicone resin may be used as a material for the cover layer 60. The cover layer 60 defines and functions as a sealing layer that seals the second electronic components 20 on the electronic component module 1. As described above, the plurality of communication modules 200 are obtained by separating an aggregate of the plurality of communication modules 200 into the individual communication modules 200 after the tenth step (FIG. 7C shows one of the plurality of communication modules 200).

A second example of the method of manufacturing the electronic component module 1 is described below with reference to FIG. 8A to FIG. 10B. The second example of the method of manufacturing the electronic component module 1 is the same or substantially the same as the first example of the method of manufacturing the electronic component module 1 and therefore description of steps similar to those in the first example is omitted as appropriate.

First, the multilayer body 112 including the support 110 having a flat-plate shape and the conductive layer 111 bonded to one surface of the support 110 in its thickness direction with the adhesive layer is prepared. Then, the resin bonding layer 113 is formed of the photosensitive positive resist on the conductive layer 111 of the multilayer body 112. Then, the first principal surfaces 21 of the electronic components 2 are caused to face the resin bonding layer 113 and the electronic components 2 are temporarily fixed to the resin bonding layer 113 (see FIG. 8A).

Figure 8A:
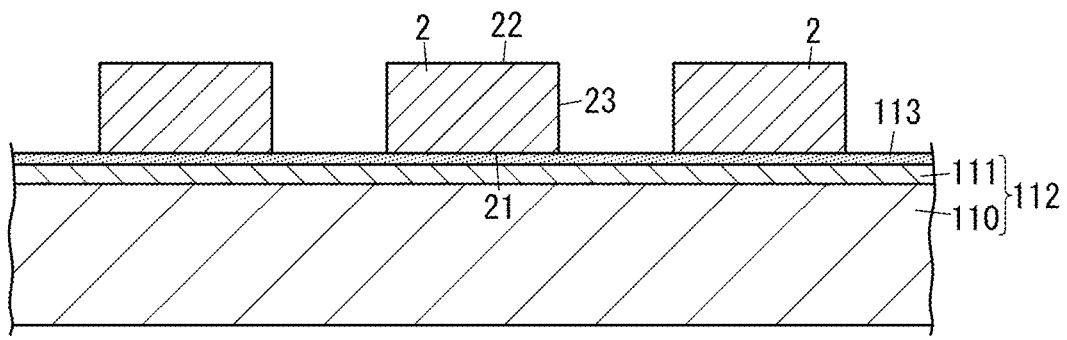
FIGS. 8A to 8C are process cross-sectional views showing a second example of the method of manufacturing the electronic component module.
Figure 8B:
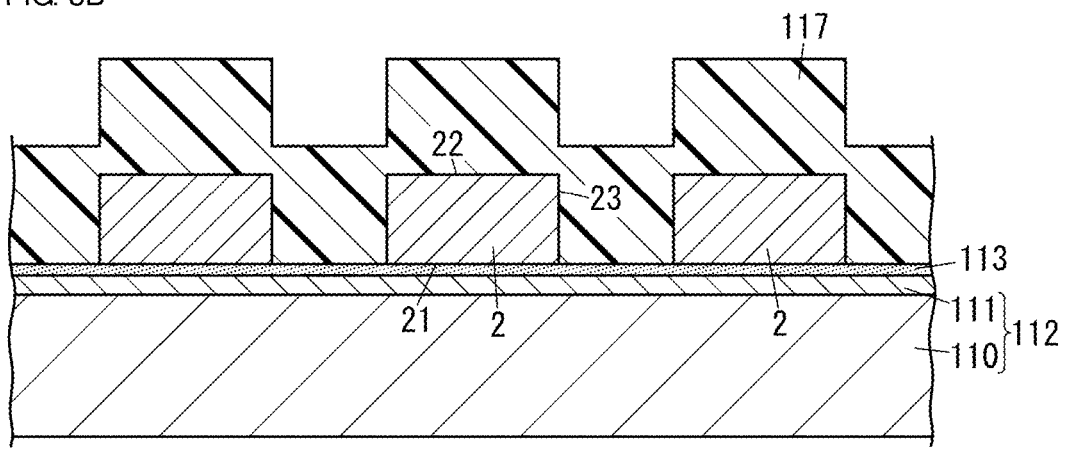
Figure 8C:
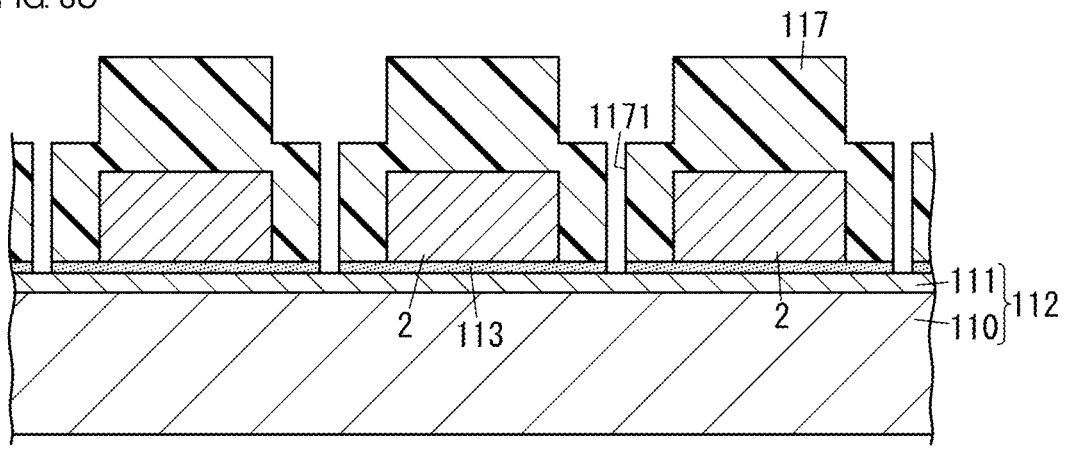

Then, a photosensitive positive resist layer 117 is formed on the multilayer body 112 and covers the second principal surfaces 22 and the lateral surfaces 23 of the electronic components 2 (see FIG. 8B). The thickness of the positive resist layer 117 is larger than the design length of the through wire 4. The thickness of the positive resist layer 117 is larger than the total thickness including the thickness of the resin bonding layer 113 and the thickness of the electronic component 2.

After the positive resist layer 117 described above is formed, portions of the positive resist layer 117 and the resin bonding layer 113 that are located at the positions where the through wires 4 are to be formed are removed by using the photolithography technique (opening portions 1171 are formed at the positions where the through wires 4 are to be formed). Thus, the ground portions for the through wires 4 (see FIG. 1A) in the conductive layer 111 are exposed (see FIG. 8C).

Figure 9A:
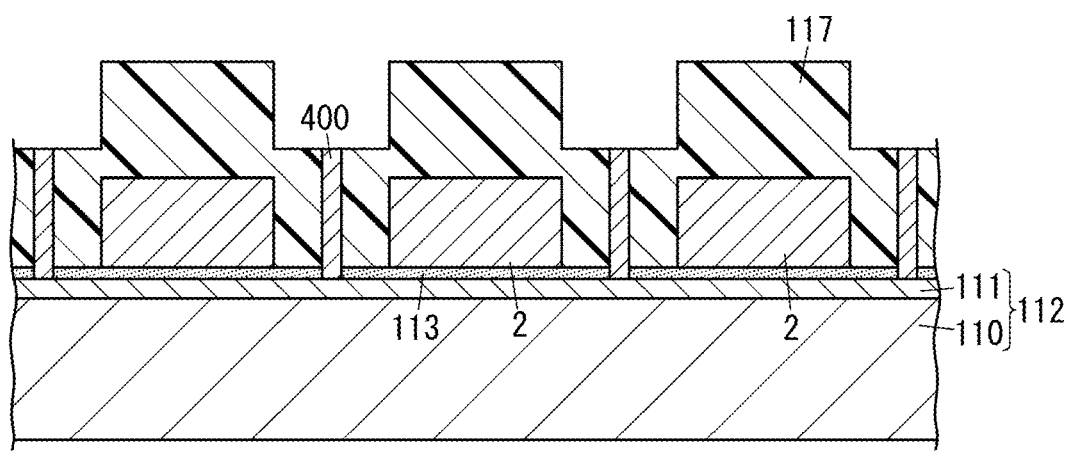
FIGS. 9A and 9B are process cross-sectional views showing the second example of the method of manufacturing the electronic component module.

Then, the conductive pillars 400 defining and functioning as the through wires 4 are formed by electrolytic plating (see FIG. 9A).

Figure 9B:
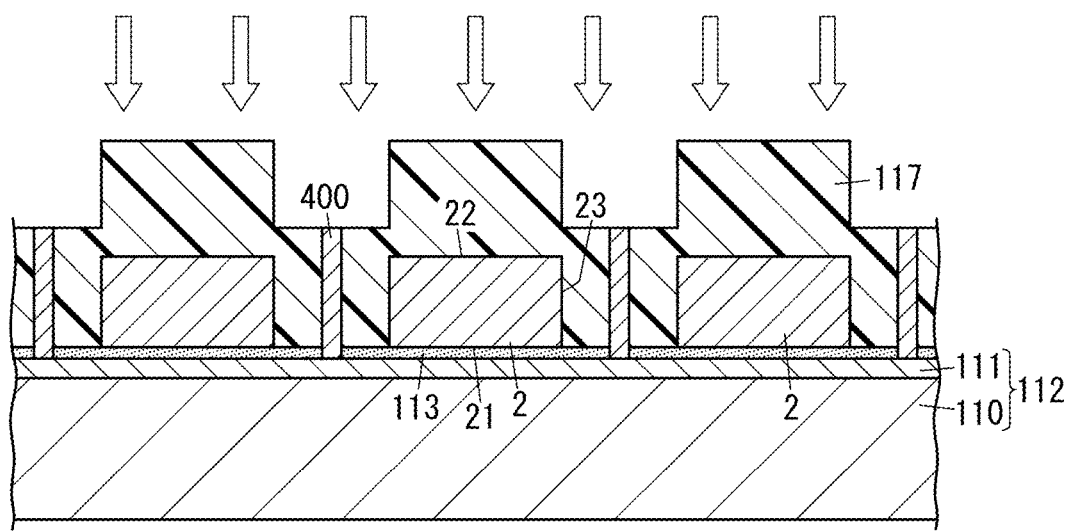

Then, the positive resist layer 117 is exposed with light from the front surface side of the positive resist layer 117 (the outline arrows in FIG. 9B indicate directions of light radiated on the positive resist layer 117). At this time, exposure conditions such as an exposure time are determined so that the exposure amount of a portion of the positive resist layer 117 (portions hardly irradiated with light in shadows) is smaller than a threshold (underexposure) near portions of the positive resist layer 117 that are located on the first principal surface 21 side of the lateral surfaces 23 of the electronic components 2.

Figure 10A:
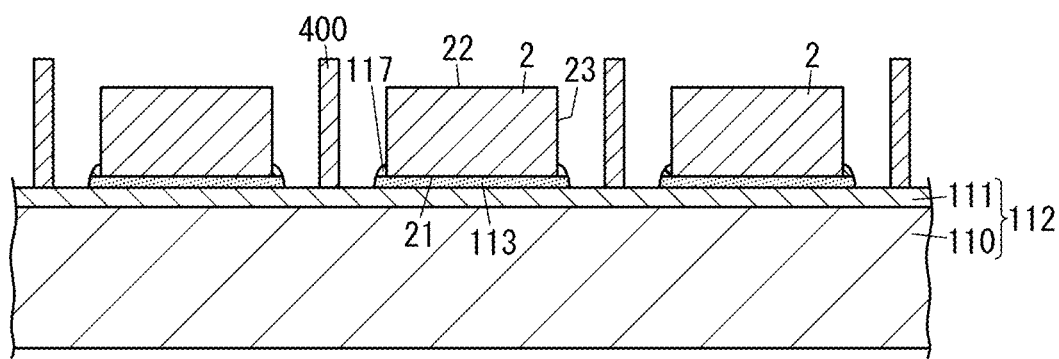
FIGS. 10A and 10B are process cross-sectional views showing the second example of the method of manufacturing the electronic component module.

Then, the positive resist layer 117 and the resin bonding layer 113 are developed with a developing solution to leave portions of the positive resist layer 117 and the resin bonding layer 113 whose exposure amounts are smaller than the threshold (see FIG. 10A).

Figure 10B:
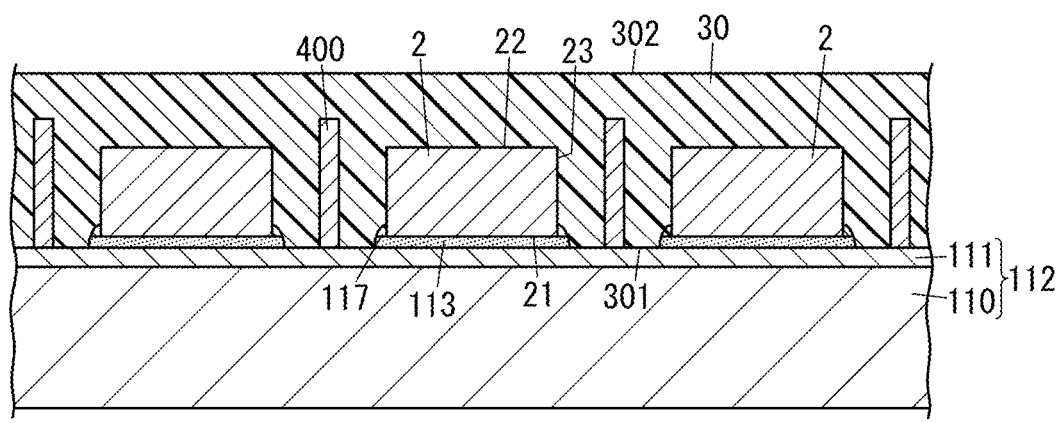

Then, the resin structure layer 30 defining and functioning as the resin structure 3 is formed on the multilayer body 112 and covers the electronic components 2, the conductive pillars 400, the exposed portions of the positive resist layer 117, the exposed portions of the resin bonding layer 113, and the exposed portions of the conductive layer 111 (see FIG. 10B).

Then, the aggregate 100 of the plurality of electronic component modules 1 (see FIG. 6B) can be obtained through steps similar to the fourth step to the eighth step in the first example. Therefore, the individual electronic component modules 1 can be obtained by cutting the aggregate 100 with the dicing machine.

The preferred embodiment described above is merely one of various preferred embodiments of the present invention. The preferred embodiment described above may be modified variously depending on design or the like as long as the advantageous effects of the present invention can be achieved.

For example, the number of protruding portions 53 of the wiring layer 5 is not limited to one and may be a plurality. The resin layer 6 interposed between a portion of the wiring layer 5 and the resin structure 3 is not an essential element. The portion of the wiring layer 5 may directly be stacked on the resin structure 3.

The electronic component module 1 of the preferred embodiment includes the plurality of wiring layers 5 directly connected to the plurality of electronic components 2, respectively (FIG. 1 shows only one of the wiring layers 5 for each of the electronic components 2). The number of wiring layers 5 is not limited to plural and may be one.

The electronic component module 1 of the preferred embodiment includes the plurality of electronic components 2 but the number of electronic components 2 is not limited to a plurality and may be, for example, one. The plurality of electronic components 2 may be electronic components of the same type or may be different electronic components. A subset of electronic components 2 out of the plurality of electronic components 2 may be the same electronic components.

Figure 11A:
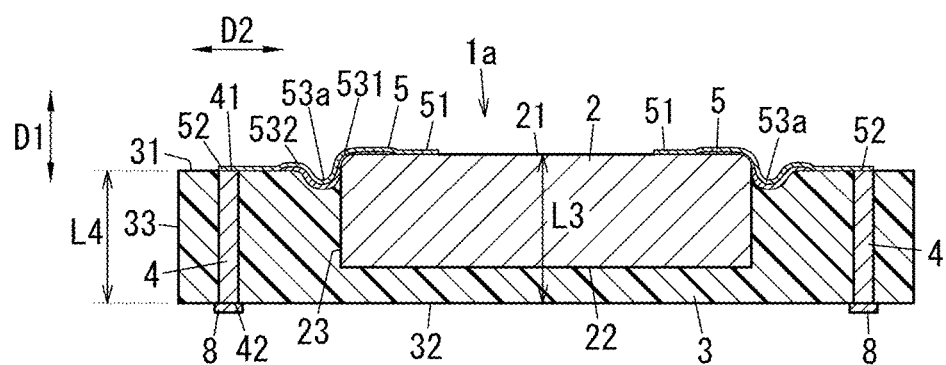
FIG. 11A is a cross-sectional view of an electronic component module according to a Modified Example 1 of the preferred embodiment of the present invention.
Figure 11B:
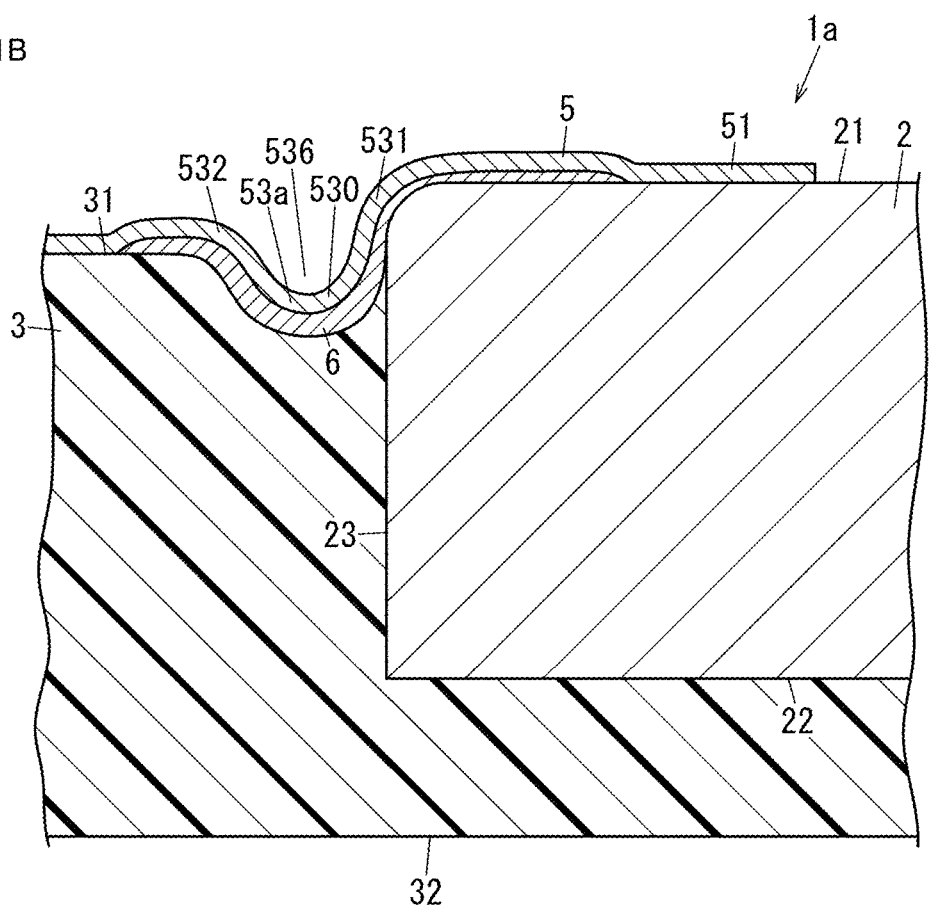
FIG. 11B is an enlarged cross-sectional view of a main portion of the electronic component module.

FIG. 11A is a cross-sectional view of an electronic component module 1a of a Modified Example 1 of the preferred embodiment. FIG. 11B is an enlarged cross-sectional view of a main portion of the electronic component module 1a. Regarding the electronic component module 1a of Modified Example 1, elements the same or similar to those of the electronic component module 1 of the preferred embodiment (see FIGS. 1A and 1B) are represented by the same reference symbols as those of the electronic component module 1 of the preferred embodiment and description thereof is omitted.

The electronic component module 1a of Modified Example 1 differs from the electronic component module 1 of the preferred embodiment in terms of a relative positional relationship between the first surface 31 of the resin structure 3 and the first principal surface 21 of the electronic component 2 in the thickness direction of the resin structure 3.

In the electronic component module 1 of the preferred embodiment (see FIG. 1A), the second surface 32 of the resin structure 3 has a planar shape and the minimum distance from the second surface 32 of the resin structure 3 to the first principal surface 21 of the electronic component 2 is shorter than the minimum distance from the second surface 32 to the first surface 31. Thus, in the electronic component module 1 of the preferred embodiment, the first principal surface 21 of the electronic component 2 is hardly flawed.

In the electronic component module 1a of Modified Example 1, the second surface 32 of the resin structure 3 has a planar shape and a distance L3 from the second surface 32 of the resin structure 3 to the first principal surface 21 of the electronic component 2 is longer than a distance L4 from the second surface 32 to the first surface 31. Thus, the height can be reduced in the electronic component module 1a of Modified Example 1.

The shape of a protruding portion 53a of the wiring layer of the electronic component module 1a of Modified Example 1 differs from that of the protruding portion 53 of the wiring layer 5 of the electronic component module 1 of the preferred embodiment. The protruding portion 53a includes the cavity 536 similarly to the protruding portion 53. More specifically, the cavity 536 is a space in the protruding portion 53a between the first portion between the distal end 530 and the first proximal end 531 and the second portion between the distal end 530 and the second proximal end 532. The distal end 530 of the protruding portion 53a is also located on the second principal surface 22 side of the electronic component 2 with respect to the first principal surface 21 and on the second surface 32 side of the resin structure 3 with respect to the first surface 31 in the protruding direction (first direction D1).

In the protruding portion 53 of the electronic component module 1 of the preferred embodiment, the first proximal end 531 is closer to the second surface 32 of the resin structure 3 than the second proximal end 532 in the first direction D1 with respect to the second surface 32. In the protruding portion 53a of the electronic component module 1a of Modified Example 1, the first proximal end 531 is farther from the second surface 32 of the resin structure 3 than the second proximal end 532 in the first direction D1 with respect to the second surface 32.

The electronic component module 1a of Modified Example 1 differs from the electronic component module 1 of the preferred embodiment in terms of the number of electronic components 2 and the layout of the through wires 4 and the wiring layers 5. In the electronic component module 1a of Modified Example 1, the number of electronic components 2 is one but is not limited to one and may be a plurality.

Figure 12:
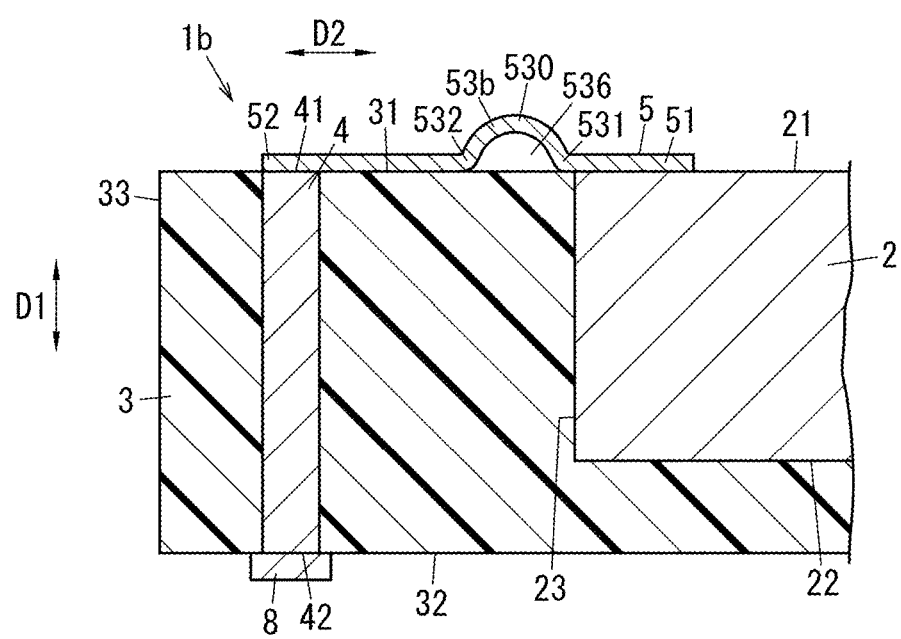
FIG. 12 is a cross-sectional view of an electronic component module according to a Modified Example 2 of the preferred embodiment of the present invention.

FIG. 12 is a cross-sectional view of an electronic component module 1b of a Modified Example 2 of the preferred embodiment. Regarding the electronic component module 1b of Modified Example 2, elements the same as or similar to those of the electronic component module 1 of the preferred embodiment (see FIGS. 1A and 1B) are represented by the same reference symbols as those of the electronic component module 1 of the preferred embodiment and description thereof is omitted.

The electronic component module 1b of Modified Example 2 differs from the electronic component module 1 of the preferred embodiment in terms of the relative positional relationship between the first surface 31 of the resin structure 3 and the first principal surface 21 of the electronic component 2 in the thickness direction of the resin structure 3. In the electronic component module 1b of Modified Example 2, the second surface 32 of the resin structure 3 has a planar shape and the distance from the second surface 32 of the resin structure 3 to the first principal surface 21 of the electronic component 2 is equal or substantially equal to the distance from the second surface 32 to the first surface 31. Therefore, the resin structure 3 covers the entire lateral surface 23 (entire surface) of the electronic component 2. Thus, the resin structure 3 covers at least a portion of the lateral surface 23 of the electronic component 2. The description "cover at least a portion of the lateral surface 23 of the electronic component 2" means that the resin structure 3 covers the entire circumference of the lateral surface 23 of the electronic component 2 at least in the range from the position shifted from the first end of the lateral surface 23 of the electronic component 2 on the first principal surface 21 side toward the second end of the lateral surface 23 on the second principal surface 22 side to the boundary between the lateral surface 23 and the second principal surface 22, including the case in which the resin structure 3 covers the entire lateral surface 23 of the electronic component 2. In the electronic component module 1b of Modified Example 2, the first surface 31 of the resin structure 3 is flush or substantially flush with the first principal surface 21 of the electronic component 2.

In the electronic component module 1b of Modified Example 2, the shape of a protruding portion 53b of the wiring layer 5 differs from the shape of the protruding portion 53 of the electronic component module 1 of the preferred embodiment.

The protruding portion 53b of the electronic component module 1b of Modified Example 2 protrudes toward an opposite side to the resin structure 3 side in the first direction D1. More specifically, the protruding portion 53b protrudes toward the opposite side to the resin structure 3 side in the thickness direction of the resin structure 3. That is, the protruding direction of the protruding portion 53b of the electronic component module 1b of Modified Example 2 is opposite to the protruding direction of the protruding portion 53 of the electronic component module 1 of the preferred embodiment in the thickness direction of the resin structure 3. The protruding portion 53b includes the cavity 536 similarly to the protruding portion 53. More specifically, the cavity 536 is a space in the protruding portion 53b between the first portion between the distal end 530 and the first proximal end 531 and the second portion between the distal end 530 and the second proximal end 532. For example, the cavity 536 can be formed by forming a sacrificial layer conforming or similar to the shape of the cavity 536 on the resin structure 3, forming the wiring layer 5 passing over the sacrificial layer, and removing the sacrificial layer by etching.

As is apparent from the preferred embodiment described above and the like, an electronic component module (1; 1a; 1b) includes the electronic component (2), the resin structure (3), the through wire (4), and the wiring layer (5). The resin structure (3) covers at least a portion of the electronic component (2). The through wire (4) extends through the resin structure (3) in the predetermined direction (D1). The wiring layer (5) electrically connects the electronic component (2) to the through wire (4). The wiring layer (5) includes the portion located between the electronic component (2) and the through wire (4) in plan view in the predetermined direction (D1). The wiring layer (5) has the protruding portion (53; 53a; 53b) that protrudes in the predetermined direction (D1) between the electronic component (2) and the through wire (4).

According to the structure described above, in the electronic component module (1; 1a; 1b), the protruding portion (53; 53a; 53b) is deformed, for example, when an external force is applied to the resin structure (3). Thus, it is likely that the break of the wiring layer (5) is significantly reduced or prevented.

In an electronic component module (1; 1a; 1b) of a preferred embodiment of the present invention, the through wire (4) is located away from the lateral surface (23) of the electronic component (2) with a portion of the resin structure (3) interposed therebetween. The wiring layer (5) is arranged across the electronic component (2), the resin structure (3), and the through wire (4) in plan view in the predetermined direction (D1). The protruding portion (53; 53a; 53b) is located on the side of the electronic component (2) and protrudes in the predetermined direction (D1).

Thus, in the electronic component module (1; 1a; 1b), the protruding portion (53; 53a; 53b) is deformed, for example, when an external force is applied to the resin structure (3) in one direction in which the through wire (4) and the electronic component (2) are arrayed. Thus, it is likely that the break of the wiring layer (5) is significantly reduced or prevented.

In an electronic component module (1; 1a; 1b) of a preferred embodiment of the present invention, the electronic component (2) includes the first principal surface (21) and the second principal surface (22) located opposite each other in the first direction (D1). The resin structure (3) has the first surface (31) and the second surface (32) located opposite each other in the first direction (D1). The resin structure (3) covers the second principal surface (22) and at least a portion of the lateral surface (23) of the electronic component (2). The through wire (4) is located away from the electronic component (2) in the second direction (D2) orthogonal to the first direction (D1). The wiring layer (5) is arranged across the first principal surface (21) of the electronic component (2), the first surface (31) of the resin structure (3), and the through wire (4). The protruding portion (53; 53a; 53b) is located on the side of the electronic component (2) in the second direction (D2) between the electronic component (2) and the through wire (4) and protrudes in the first direction (D1).

Thus, in the electronic component module (1; 1a; 1b), the protruding portion (53; 53a; 53b) is deformed, for example, when an external force is applied to the resin structure (3) in one direction of the second direction (D2). Thus, it is likely that the break of the wiring layer (5) is significantly reduced or prevented.

The description "cover the second principal surface (22) and at least a portion of the lateral surface (23) of the electronic component (2)" means that the resin structure (2) covers the second principal surface (22) of the electronic component (2) and the entire circumference of the lateral surface (23) of the electronic component (2) at least in the range from the position shifted from the first end of the lateral surface (23) on the first principal surface (21) side toward the second end of the lateral surface (23) on the second principal surface (22) side to the boundary between the lateral surface (23) and the second principal surface (22), including the case in which the resin structure (3) covers the second principal surface (22) and the entire lateral surface (23) of the electronic component (2).

In an electronic component module (1; 1a; 1b) of a preferred embodiment of the present invention, the minimum distance (L1) between the boundary between the first principal surface (21) and the lateral surface (23) of the electronic component (2) and the protruding portion (53; 53a; 53b) is shorter than the minimum distance (L2) between the through wire (4) and the protruding portion (53; 53a; 53b). Thus, in the electronic component module (1; 1a; 1b), the break of the wiring layer (5) can further be significantly reduced or prevented.

In an electronic component module (1a) of a preferred embodiment of the present invention, the distance (L3) from the second surface (32) of the resin structure (3) to the first principal surface (21) of the electronic component (2) is longer than the distance (L4) from the second surface (32) to the first surface (31). Thus, the height can be reduced in the electronic component module (1a).

In an electronic component module (1; 1a; 1b) of a preferred embodiment of the present invention, the protruding portion (53; 53a; 53b) is rounded. Thus, in the electronic component module (1; 1a; 1b), the break of the wiring layer (5) can further be significantly reduced or prevented.

In an electronic component module (1; 1a) of a preferred embodiment of the present invention, the protruding portion (53; 53a) protrudes toward the resin structure (3) in the first direction (D1). Thus, in the electronic component module (1; 1a), the break of the wiring layer (5) is more unlikely to occur.

An electronic component module (1; 1a) of a preferred embodiment of the present invention further includes the resin layer (6) interposed between the wiring layer (5) and each of the resin structure (3) and the electronic component (2). In the electronic component module (1; 1a), the Young's modulus of the resin layer (6) is smaller than the Young's modulus of the resin structure (3). Thus, in the electronic component module (1; 1a), the break of the wiring layer (5) is more unlikely to occur.

In an electronic component module (1; 1a) of a preferred embodiment of the present invention, the resin layer (6) has a shape conforming or similar to the shape of the wiring layer (5). Thus, in the electronic component module (1; 1a), the break of the wiring layer (5) is more unlikely to occur.

In an electronic component module (1; 1a) of a preferred embodiment of the present invention, the wiring layer (5) further includes the first end (51) connected to the first principal surface (21) of the electronic component (2), and the second end (52) connected to the through wire (4). The protruding portion (53) is provided between the first end (51) and the second end (52). The electronic component module (1; 1a) further includes the external connection electrode (7) formed on the second end (52) of the wiring layer (5), and the resist layer (9) formed on the wiring layer (5) between the second end (52) and the protruding portion (53) of the wiring layer (5). The resist layer (9) is formed of the material having a lower wettability than those for the electrode (7) and the wiring layer (5).

In an electronic component module (1; 1a; 1b) of a preferred embodiment of the present invention, the protruding portion (53; 53a; 53b) has the cavity (536) isolated from the resin structure (3). Thus, in the electronic component module (1; 1a; 1b), the protruding portion (53; 53a; 53b) is likely to deform, for example, when an external force is applied to the resin structure (3) in one direction of the second direction (D2). Thus, the break of the wiring layer (5) can be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component module, comprising:
    an electronic component;
    a resin structure that covers at least a portion of the electronic component;
    a through wire that extends through the resin structure in a predetermined direction;
    a wiring layer that electrically connects the electronic component to the through wire and includes a portion located between the electronic component and the through wire in plan view in the predetermined direction; and
    a resin layer between the wiring layer and the electronic component, and between the wiring layer and the resin structure; wherein
    the wiring layer includes a protruding portion that protrudes in the predetermined direction between the electronic component and the through wire; and
    the resin layer covers at least a portion of a surface of the resin structure and at least a portion of a first principal surface of the electronic component.

2. The electronic component module according to claim 1, wherein
    the through wire is located away from a lateral surface of the electronic component with a portion of the resin structure located therebetween;
    the wiring layer is provided across the electronic component, the resin structure, and the through wire in plan view in the predetermined direction; and
    the protruding portion is located on a side of the electronic component and protrudes in the predetermined direction.

3. The electronic component module according to claim 2, wherein
    the electronic component includes the first principal surface and a second principal surface located opposite each other in a first direction that is the predetermined direction;
    the resin structure includes a first surface and a second surface located opposite each other in the first direction and covers the second principal surface and at least a portion of the lateral surface of the electronic component;
    the through wire is located away from the electronic component in a second direction orthogonal or substantially orthogonal to the first direction;
    the wiring layer is provided across the first principal surface of the electronic component, the first surface of the resin structure, and the through wire; and
    the protruding portion is located on the side of the electronic component and protrudes in the first direction.

4. The electronic component module according to claim 3, wherein a minimum distance between a boundary between the first principal surface and the lateral surface of the electronic component and the protruding portion is shorter than a minimum distance between the through wire and the protruding portion.

5. The electronic component module according to claim 3, wherein a distance from the second surface of the resin structure to the first principal surface of the electronic component is longer than a distance from the second surface to the first surface.

6. The electronic component module according to claim 3, wherein the protruding portion is rounded.

7. The electronic component module according to claim 3, wherein the protruding portion protrudes toward the resin structure in the first direction.

8. The electronic component module according to claim 7, wherein
    a Young's modulus of the resin layer is smaller than a Young's modulus of the resin structure.

9. The electronic component module according to claim 8, wherein the resin layer has a shape that conforms to or is similar to a shape of the wiring layer.

10. The electronic component module according to claim 3, wherein
    the wiring layer further includes a first end connected to the first principal surface of the electronic component, and a second end connected to the through wire;
    the protruding portion is provided between the first end and the second end;
    the electronic component module further includes an external connection electrode provided on the second end of the wiring layer, and a resist layer provided on the wiring layer between the second end and the protruding portion of the wiring layer; and
    the resist layer includes a material having a lower wettability than materials for the electrode and the wiring layer.

11. The electronic component module according to claim 2, wherein
    the electronic component includes a first principal surface and a second principal surface located opposite each other in a first direction that is the predetermined direction;
    the resin structure includes a first surface and a second surface located opposite each other in the first direction;
    the through wire is located away from the electronic component in a second direction orthogonal to the first direction;
    the wiring layer is provided across the first principal surface of the electronic component, the first surface of the resin structure, and the through wire;
    the protruding portion is located on the side of the electronic component and protrudes toward the resin structure in the first direction; and
    a distal end of the protruding portion is located on the second principal surface side of the electronic component with respect to the first principal surface of the electronic component in the first direction and on the second principal surface side of the resin structure with respect to the first principal surface of the resin structure in the first direction.

12. The electronic component module according to claim 1, wherein the through wire extends completely through an entirety of the resin structure in the predetermined direction.

13. The electronic component module according to claim 1, wherein the electronic component is included in a plurality of electronic components that are each at least partially covered by the resin structure.

14. The electronic component module according to claim 13, wherein
    at least a first one of the plurality of electronic components is a surface acoustic wave filter, a bulk acoustic wave filter, a radio frequency switch, a thin film capacitor, or a semiconductor device; and at least a second one of the plurality of electronic components is an integrated circuit, an inductor, or a surface acoustic wave filter.

15. A communication module, comprising:
the electronic component module according to claim 1;
a radio frequency switch;
a transmission filter;
a reception filter;
a power amplifier;
a low-noise amplifier; and
a signal processing circuit.

16. The electronic component module according to claim 1, wherein the electronic component includes a piezoelectric substrate, a plurality of interdigital transducer electrodes, and at least one external connection terminal electrode.

17. The electronic component module according to claim 13, wherein
the through wire is included in a plurality of through wires; and
each of the plurality of through wires is arranged on a side of a corresponding one of each of the plurality of electronic components.

18. An electronic component module, comprising:
an electronic component;
a resin structure that covers at least a portion of the electronic component;
a through wire that extends through the resin structure in a predetermined direction;
a wiring layer that electrically connects the electronic component to the through wire and includes a portion located between the electronic component and the through wire in plan view in the predetermined direction; and
a resin layer; wherein
the wiring layer includes a protruding portion that protrudes in the predetermined direction between the electronic component and the through wire;
a boundary between a first principal surface of the electronic component and a lateral surface of the electronic component is not covered by the resin structure; and
the resin layer covers at least a portion of a surface of the resin structure, at least a portion of the first principal surface of the electronic component, and at least a portion of the lateral surface of the electronic component.

* * * * *